(12) United States Patent
Wang et al.

(10) Patent No.: US 12,317,593 B2
(45) Date of Patent: May 27, 2025

(54) ARRAY SUBSTRATE AND DISPLAY PANEL HAVING ARRAY SUBSTRATE

(71) Applicants: Fuzhou BOE Optoelectronics Technology Co., Ltd., Fujian (CN); BOE TECHNOLOGY GROUP CO., LTD., Beijing (CN)

(72) Inventors: Jinliang Wang, Beijing (CN); Chen Lin, Beijing (CN); Jixiang Chen, Beijing (CN); Wenchao Wang, Beijing (CN)

(73) Assignees: Fuzhou BOE Optoelectronics Technology Co., Ltd., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 765 days.

(21) Appl. No.: 17/600,350

(22) PCT Filed: Dec. 29, 2020

(86) PCT No.: PCT/CN2020/140527
§ 371 (c)(1),
(2) Date: Sep. 30, 2021

(87) PCT Pub. No.: WO2021/169561
PCT Pub. Date: Sep. 2, 2021

(65) Prior Publication Data
US 2022/0130870 A1    Apr. 28, 2022

(30) Foreign Application Priority Data

Feb. 26, 2020    (CN) .......................... 202010118417.3

(51) Int. Cl.
*H10D 86/60*    (2025.01)
*G03F 1/32*    (2012.01)
(Continued)

(52) U.S. Cl.
CPC ............... *H10D 86/60* (2025.01); *G03F 1/32* (2013.01); *H10D 86/0231* (2025.01); *H10D 86/441* (2025.01); *G02F 1/136295* (2021.01)

(58) Field of Classification Search
CPC ............... H01L 27/124; G02F 2201/40; G02F 1/136286
See application file for complete search history.

(56) References Cited

U.S. PATENT DOCUMENTS

| 9,891,518 B2 | 2/2018 | Wang et al. | |
| 2003/0197187 A1* | 10/2003 | Kim | G02F 1/13458 257/E27.113 |
| 2018/0175081 A1 | 6/2018 | Dong et al. | |

FOREIGN PATENT DOCUMENTS

| CN | 101494201 A | 7/2009 |
| CN | 104155842 A | 11/2014 |

(Continued)

OTHER PUBLICATIONS

China Patent Office, First Office Action dated May 17, 2022, for corresponding Chinese application 202010118417.3.

*Primary Examiner* — Jay C Chang
*Assistant Examiner* — Mikka Liu
(74) *Attorney, Agent, or Firm* — HOUTTEMAN LAW LLC

(57) ABSTRACT

An array substrate of this disclosure includes: a substrate and a first conductive layer and a second conductive layer sequentially stacked on the substrate; orthographic projections of the first and second conductive layers on the substrate have an overlapping region; portions of the first and second conductive layers in the overlapping region constitute a first conductive pattern; a portion of the first conductive layer outside the overlapping region includes a second conductive pattern and a third conductive pattern; the second and third conductive patterns have an interval ther- (Continued)

ebetween. A first distance between first regions of the second and third conductive patterns proximal to the first conductive pattern is larger than a second distance between second regions of the second and third conductive patterns distal to the first conductive pattern.

18 Claims, 4 Drawing Sheets

(51) Int. Cl.
  *H10D 86/01* (2025.01)
  *H10D 86/40* (2025.01)
  *G02F 1/1362* (2006.01)

(56) References Cited

FOREIGN PATENT DOCUMENTS

| | | | | |
|---|---|---|---|---|
| CN | 105810688 | A | 7/2016 | |
| CN | 105929610 | A | 9/2016 | |
| CN | 106898619 | A | 6/2017 | |
| CN | 107132724 | A | 9/2017 | |
| CN | 207367974 | A | 5/2018 | |
| CN | 106898619 | B * | 5/2020 | ......... H01L 27/1214 |
| CN | 111326528 | A | 6/2020 | |
| EP | 3640976 | A | 4/2020 | |

\* cited by examiner

ARRAY SUBSTRATE AND DISPLAY PANEL HAVING ARRAY SUBSTRATE

CROSS-REFERENCE TO RELATED APPLICATION

This is a National Phase Application filed under 35 U.S.C. 371 as a national stage of PCT/CN2020/140527, filed on Dec. 29, 2020, the contents of which are incorporated herein in their entirety by reference.

TECHNICAL FIELD

The embodiments of the present disclosure belong to the field of display technology, and particularly relates to an array substrate, a manufacturing method for the array substrate, a mask and a display panel.

BACKGROUND

As users' requirements on the image quality of liquid crystal display products increase, the resolution of the screen needs to be improved. Therefore, pixels tend to be smaller and smaller without changing a size of the display region. On the other hand, considering the requirement on the transmittance, a line width and a line interval on a pixel layout are reduced, which causes the short circuit of some lines to easily occur when a motherboard is manufactured.

SUMMARY

The embodiments of the present disclosure provide an array substrate, a manufacturing method for the array substrate, a mask and a display panel.

In a first aspect, an embodiment of the present disclosure provides an array substrate, including: a substrate, and a first conductive layer and a second conductive layer sequentially stacked on the substrate; an orthographic projection of the first conductive layer on the substrate and an orthographic projection of the second conductive layer on the substrate have an overlapping region; portions of the first conductive layer and the second conductive layer in the overlapping region constitute a first conductive pattern; the first conductive pattern has a pattern extending along a first direction; a portion of the first conductive layer outside the overlapping region includes a second conductive pattern and a third conductive pattern; the second conductive pattern and the third conductive pattern have an interval therebetween, are connected to the first conductive pattern, respectively, are on a same side of the first conductive pattern and extend along a second direction; wherein a first distance between a first region of the second conductive pattern proximal to the first conductive pattern and a first region of the third conductive pattern proximal to the first conductive pattern is larger than a second distance between a second region of the second conductive pattern distal to the first conductive pattern and a second region of the third conductive pattern distal to the first conductive pattern.

In some embodiments, the second conductive pattern and the third conductive pattern are the same in shape and size, and are mirror-symmetrical with a center line of the interval as an axis;
    a ratio of a size of the first region along the second direction to a size of the second region along the second direction ranges from 1/20 to 1.

In some embodiments, a size ratio of the second distance to the first distance is in a range of $X/(X+L'/5)$ to $X/(X+L'/10)$, where X is a size of the second distance, L' is a width of each of the second regions of the second conductive pattern and the third conductive pattern along the first direction; and a width of each of the first regions of the second conductive pattern and the third conductive pattern along the first direction is in a range of $9L'/10$ to $19L'/20$.

In some embodiments, a size of the first region along the second direction is greater than or equal to 5 μm.

In some embodiments, the first distance is greater than or equal to 20 μm.

In some embodiments, the second distance is 16 μm and the first distance is 23 μm.

In some embodiments, a spacing region between the first regions of the second conductive pattern and the third conductive pattern includes a first sub-region and a second sub-region sequentially arranged away from the first conductive pattern along the second direction.

In some embodiments, an orthographic projection of the first sub-region on the substrate is rectangular, and an orthographic projection of the second sub-region on the substrate is trapezoidal; and
    a shorter base of the second sub-region is further away from the first conductive pattern than a longer base of the second sub-region.

In some embodiments, two opposite edge lines of a spacing region between the first regions of the second and third conductive patterns are in a semi-circular arc shape.

In some embodiments, the first conductive pattern is a common electrode signal line, and the second conductive pattern and the third conductive pattern are common electrodes respectively at adjacent pixel regions;
    the array substrate further includes an insulating layer and a data line sequentially stacked on a side of the second conductive layer distal to the substrate; and
    an orthographic projection of the insulating layer on the substrate covers the whole substrate, and an orthographic projection of the data line on the substrate is in a spacing region between the second conductive pattern and the third conductive pattern and extends to intersect with the first conductive pattern.

In a second aspect, an embodiment of the present disclosure provides a mask, including a first semi-transparent region, a second semi-transparent region, and a third region, wherein the third region has a pattern extending along a first direction; the first semi-transparent region and the second semi-transparent region have an interval therebetween; the first semi-transparent region and the second semi-transparent region are respectively connected to the third region, are on a same side of the third region and extend along a second direction; wherein a first distance between a first portion of the first semi-transparent region proximal to the third region and a first portion of the second semi-transparent region proximal to the third region is greater than a second distance between a second portion of the first semi-transparent region distal to the third region and a second portion of the second semi-transparent region distal to the third region.

In some embodiments, the first semi-transparent region and the second semi-transparent region are the same in shape and size, and are mirror-symmetrical with a center line of the interval as an axis; and
    a ratio of a size of the first portion along the second direction to a size of the second portion along the second direction ranges from 1/20 to 1.

In some embodiments, a size ratio of the second distance to the first distance is in a range of $X/(X+L/5)$ to $X/(X+L/10)$, where X is a size of the second distance, L is a width of each of the second portions of the first semi-transparent region and the second semi-transparent region along the first direction; and a width of each of the first portions of the first semi-transparent region and the second semi-transparent region along the first direction is in a range of 9L/10 to 19L/20.

In some embodiments, a size of the first portion along the second direction is greater than or equal to 5 μm.

In some embodiments, the first distance is greater than or equal to 20 μm.

In some embodiments, the second distance is 16 μm and the first distance is 23 μm.

In some embodiments, a spacing region between the first portions of the first and second semi-transparent regions is rectangular.

In some embodiments, two opposite edge lines of a spacing region between the first portions of the first and second semi-transparent regions are in a semi-circular arc shape.

In a third aspect, an embodiment of the present disclosure provides a display panel, which includes the array substrate in the foregoing embodiments and an opposite substrate.

In a fourth aspect, an embodiment of the present disclosure provides a method for manufacturing an array substrate, including steps of:

sequentially forming a first conductive layer film and a second conductive layer film on a substrate, and forming a photoresist on the second conductive layer film;

exposing and developing the substrate on which the photoresist is formed, by using the above mask, and then, removing the photoresist on the substrate corresponding to a spacing region between the first semi-transparent region and the second semi-transparent region, partially reserving the photoresist on the substrate corresponding to the first semi-transparent region and the second semi-transparent region is reserved, and completely reserving the photoresist on the substrate corresponding to the third region;

removing the second conductive layer film and the first conductive layer film on the substrate corresponding to the spacing region between the first semi-transparent region and the second semi-transparent region, by an etching process;

completely removing the photoresist on the substrate corresponding to the first semi-transparent region and the second semi-transparent region, and removing the completely reserved photoresist on the substrate corresponding to the third region;

removing the second conductive layer film on the substrate corresponding to the first semi-transparent region and the second semi-transparent region to form a second conductive pattern and a third conductive pattern, by an etching process; and removing a remaining portion of the completely reserved photoresist on the substrate corresponding to the third region, thereby forming a first conductive pattern.

BRIEF DESCRIPTION OF DRAWINGS

The accompanying drawings, which are provided for a further understanding of the present disclosure and constitute a part of this specification, serve to explain the present disclosure together with the following exemplary embodiments, but are not intended to limit the present disclosure. The above and other features and advantages will become more apparent to one of ordinary skill in the art by describing in detail exemplary embodiments thereof with reference to the drawings. In the drawings:

FIG. 3 is a partial sectional view taken along a section line PP at the A of FIG. 2 during the manufacturing process;

Figure 1A:
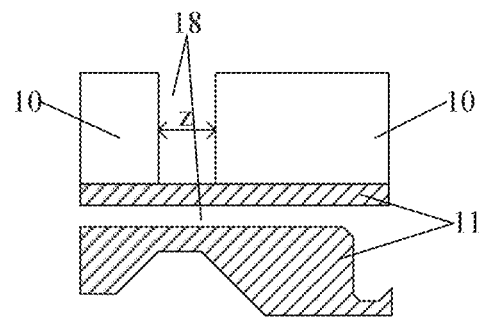
FIG. 1a is a top view of a partial structure of a half tone gate mask.

Reference numbers are:

1. First semi-transparent region; 2. Second semi-transparent region; 3. Third region; 101. First portion; 102. Second portion; 4. Substrate; 5. First conductive layer; 6. Second conductive layer; 7. First conductive pattern; 8. Second conductive pattern; 9. Third conductive pattern; 201. First region; 202. Second region; 10. Half tone mask; 11. Light-shielding film region; 12. Common electrode; 13. Common electrode signal line; 14. Transparent conductive film layer; 15. Gate metal film layer; 16. PR adhesive; 17. Half tone gate mask; 18. Transparent region; 19. Gate electrode; 20. Gate line; 21. Fourth region; 22. Data line; E. First direction; F. Second direction.

DETAIL DESCRIPTION OF EMBODIMENTS

In order to enable one of ordinary skill in the art to better understand the technical solutions of the embodiments of the present disclosure, a mask, a array substrate, a manufacturing method for the array substrate, and a display panel provided in the embodiments of the present disclosure are described in further detail below with reference to the accompanying drawings and the detailed description.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that this disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Thus, regions illustrated in the drawings are schematic, and shapes of the regions shown in the drawings illustrate specific shapes of the regions, but are not intended to be limiting.

Figure 1B:
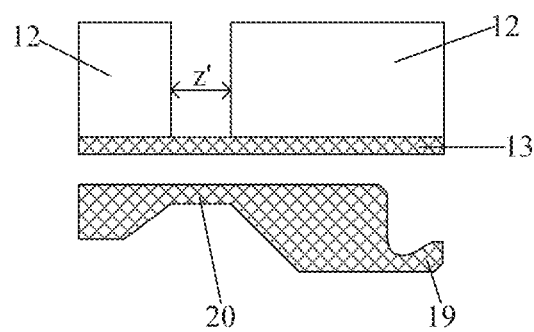
FIG. 1b is a top view of a partial structure of an array substrate formed by using the half tone gate mask of FIG. 1a through an exposure process.

For a 0+X Mask process product, 0 refers to HGA mask (half tone gate mask) used for exposing and obtaining patterns of a transparent (light-transmitting) common electrode and an opaque (light-proof) common electrode line of an ADS array substrate. In the related art, as shown in FIGS. 1a and 1b, on the HGA Mask, a portion of a "three-sided loop" formed by a half tone mask 10 (HTM)/a light-shielding film region 11 (Cr, Cr film region)/the half tone mask 10 (HTM) is used for simultaneously forming transparent common electrodes 12 and an opaque common electrode signal line 13 adjacent to each other through an exposure process. In addition, the light-shielding film region 11 is also used for simultaneously forming a gate electrode 19 and a gate line 20 through an exposure process. A transparent region 18 enclosed between the half tone mask 10 and the light-shielding film region 11 is used for forming a spacing region between the adjacent common electrodes 12, a spacing region between the common electrode signal line 13 and the gate line 20, and other regions where it is not necessary to form any conductive pattern, through an exposure process. In the process of forming the common electrode 12 and the common electrode signal line 13 simultaneously through one exposure process, two wet etching processes are required. After the wet etching processes, etching solution easily remains in a region of the "three-sided loop" formed by the light-transmitting conductive film layer and the light-proof conductive film layer which are overlapped with each other. Corrosion occurs at an edge of the upper light-proof conductive film layer in the region, and conductive metal particles are formed. A distance z between adjacent half tone masks 10 of adjacent half tone gate masks is small, so that a distance z between adjacent common electrodes 12 is small, which easily causes the conductive metal particles to sharply accumulate in the narrow region of the "three-sided loop", and easily causes subsequently deposited conductive film layers (such as a data line film layer) to be short-circuited with the light-proof conductive film layers in the narrow region.

Figure 2:
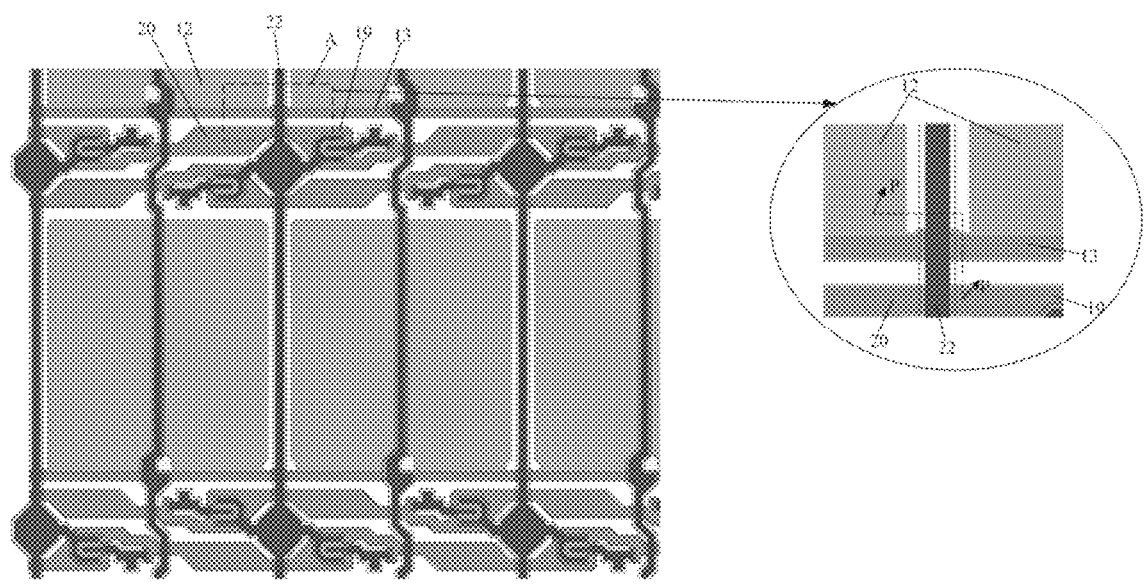
FIG. 2 is a top plan view of a pixel design of an ADS type array substrate, with an enlarged view at A.

Specifically, for example, for ADS (Advanced Super Dimension Switch) display products, FIG. 2 is a plan view of a conventional pixel design of an array substrate in the related art. The common electrode 12 and the common electrode signal line 13 early formed on the substrate are formed simultaneously by a one-step patterning process, the common electrode 12 is formed by a transparent conductive material layer located at a relatively bottom layer, and the common electrode signal line 13 is formed by a stack of a transparent conductive material layer located at a relatively bottom layer and a gate metal material layer located at a relatively top layer. A gate electrode 19 and a gate line 20 are formed simultaneously with the common electrode 12 and the common electrode signal line 13. When the HGA Mask (half tone gate mask) is used to form patterns of the common electrode 12 and the common electrode signal line 13, a pattern of the common electrode 12 is formed by the half tone mask 10 of the mask in FIG. 1, and a pattern of the common electrode signal line 13 is formed by the light-shielding film region 11 of the mask in FIG. 1. The light-shielding film region 11 is formed with a light-shielding film, for example, made of chromium. A pattern of a spacing region between the common electrode 12 and the common electrode signal line 13 is formed by the transparent region 18 of the mask in FIG. 1. In FIG. 2, at A, the portion corresponding to "three-sided loop" of the mask formed by the half tone mask 10/the light-shielding film region 11/the half tone mask 10 in FIG. 1 is formed by exposure.

Figure 3:
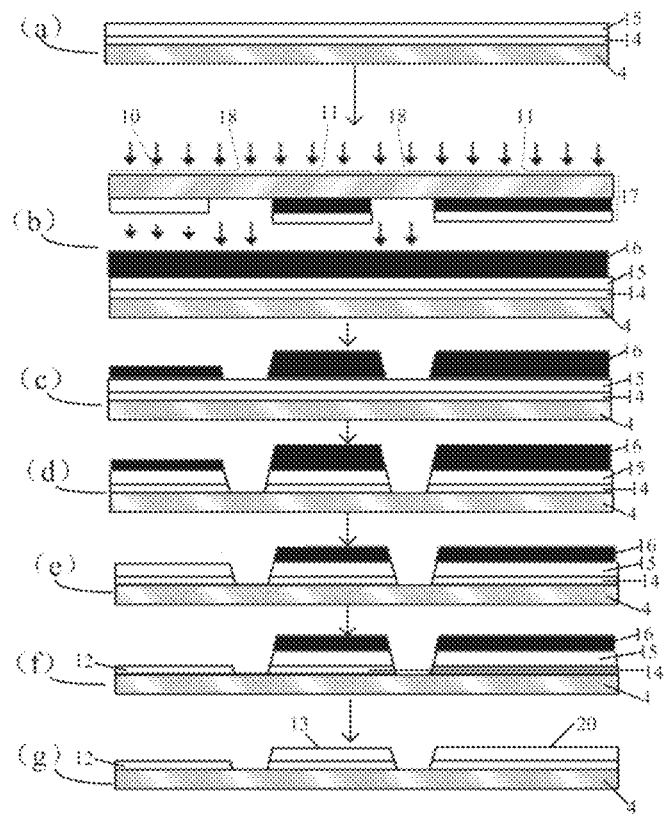
FIG. 3 is a schematic diagram showing a process of forming a common electrode and a common electrode signal line on the array substrate of FIG. 2 by using the half tone gate mask of FIG. 1a through an exposure and etching process.

FIG. 3 shows exemplary exposing and etching processes when forming the patterns of the common electrode and the common electrode signal line on the substrate by using the HGA mask (the half tone gate mask). (a) Firstly, the transparent conductive film layer 14 and the gate metal film layer 15 are sequentially formed on the substrate 4 by a sputtering process. A material of the substrate 4 may be glass. (b) Then, a PR adhesive (photoresist) 16 is coated on the gate metal film layer 15; under the exposure with the half tone gate mask 17, different quantities of exposure light passing through the half tone gate mask 17 affect the PR adhesive 16; (c) under the action of the developing solution, all the PR adhesive in a region corresponding to the light-transmitting region 18 (in which neither a semi-transparent film nor a light-shielding film is disposed) on the half tone gate mask 17 is removed, a part of the PR adhesive 16 in a region corresponding to the half tone mask 10 (in which a semi-transparent film is disposed) is removed (for example, the PR adhesive is removed by ⅓ in thickness), and the PR adhesive 16 in a region corresponding to the light-shielding film region 11 (in which a light-shielding film is disposed) is completely reserved; (d) the gate metal film layer 15 and the transparent conductive film layer 14 are sequentially etched in a region not covered by the PR adhesive on the substrate 4 by selecting different etching solutions; (e) the remaining PR adhesive 16 is removed by ⅔ in thickness through an ashing process, so that the PR adhesive in the region corresponding to the half tone mask 10 on the half tone gate mask 17 is completely removed, and the PR adhesive 16 in the region corresponding to the light-shielding film region 11 remains about ⅓ of the thickness; (f) the gate metal film layer 15 is etched in the region not covered by the PR adhesive on the substrate 4 by using an etching solution, so that there is only the transparent conductive film layer existing in the region corresponding to the half tone mask 10 on the half tone gate mask 17 on the substrate, thereby forming the pattern of the common electrode 12; (g) finally, the PR adhesive in the region corresponding to the light-shielding film region 11 on the half tone gate mask 17 on the substrate is removed, thereby forming the pattern of the common electrode signal line 13.

In the above exposing and etching process of forming patterns of the common electrode and the common electrode signal line on the substrate by using the HGA Mask (a half tone gate mask), the "three-sided loop" is formed by the half tone mask 10 (HTM)/the light-shielding film region 11 (Cr film region)/the half tone mask 10 (HTM) on the half tone gate mask 17, when the distance z between the two half tone masks 10 is small (for example, z≤20 μm), a position corresponding to the "three-sided loop" formed on the substrate undergoes two wet etching processes, etching solution remains and gathers at the "three-sided loop" position during the two wet etching processes, which corrodes the edge of the gate metal film layer at the "three-sided loop" position, thereby forming metal particles (for example, copper (Cu) particles). In the case where z is small, the metal particles due to the corrosion accumulate in a space range with a smaller width, and in this case, metal particle accumulation with a sharper appearance is easily formed. The accumulation may easily penetrate through an insulating layer subsequently formed on the gate metal film layer and in turn contact a source drain metal layer formed after the insulating layer is formed. As an orthographic projection of a data line 22 formed by the source drain metal layer on the substrate is just positioned in a spacing region between two common electrodes 12, and the data line 22 also extends to spatially intersect with the common electrode signal line 13, a short circuit is easily generated between the data line 22 and the common electrode signal line 13.

In order to solve the problem that the conductive film layer in the "three-sided loop" region formed by using the half tone gate mask is easily short-circuited with the conductive film layer formed subsequently in the region, an exemplary embodiment of the disclosure provides an array substrate, a manufacturing method for the array substrate, a mask and a display panel.

Figure 4:
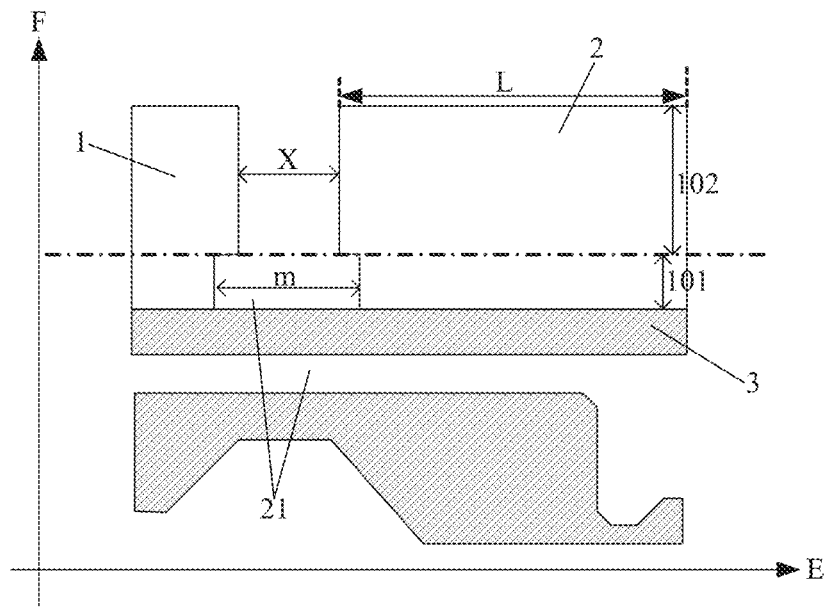
FIG. 4 is a top view of a partial structure of a mask in an exemplary embodiment of the present disclosure.

An exemplary embodiment of the present disclosure provides a mask, as shown in FIG. 4, including a first semi-transparent region 1, a second semi-transparent region 2, and a third region 3, and the third region 3 has a pattern extending along a first direction E; the first semi-transparent region 1 and the second semi-transparent region 2 have an interval therebetween; the first semi-transparent region 1 and the second semi-transparent region 2 are respectively connected to the third region 3, are located on the same side of the third region 3 and extend along a second direction F; and a first distance between a first portion 101 of the first semi-transparent region 1 proximal to the third region 3 and a first portion 101 of the second semi-transparent region 2 proximal to the third region 3 is greater than a second distance between a second portion 102 of the first semi-transparent region 1 distal to the third region 3 and a second portion 102 of the second semi-transparent region 2 distal to the third region 3.

The ADS (Advanced Super Dimension Switch) array substrate is formed by exposing with the mask. The first semi-transparent region 1 and the second semi-transparent region 2 are respectively used for exposing and forming the pattern of the common electrode in a pixel region on the array substrate, and the third region 3 is used for exposing and forming the pattern of the common electrode signal line on the array substrate. In addition, the mask further includes a fourth region 21, which is used for exposing and forming a spacing region between the common electrodes on the array substrate. It should be noted that, when the photoresist used in the exposure is a positive photoresist, the third region 3 of the mask is a light-shielding region, and the fourth region 21 of the mask is a transparent region; when the photoresist used in the exposure is a negative photoresist, the third region 3 of the mask is a transparent region, and the fourth region 21 of the mask is a light-shielding region. In this embodiment, the positive photoresist is used for exposure, so that the third region 3 is a transparent region and the fourth region 21 is a light-shielding region. The second distance between the second portion 102 of the first semi-transparent region 1 distal to the third region 3 and the second portion 102 of the second semi-transparent region 2 distal to the third region 3 is relatively small, such as less than 20 μm, such that an area of the first semi-transparent region 1 and the second semi-transparent region 2 can be increased compared with the mask in which a distance between the first semi-transparent region 1 and the second semi-transparent region 2 is set to be the second distance, thereby increasing an area of the common electrode in the pixel region on the array substrate, and increasing an aperture area in the pixel region to increase the light transmittance in the pixel region. As a result, it is ensured that the aperture ratio and the light transmittance in the array substrate are increased while the array substrate has a higher resolution.

The first distance between the first portion 101 of the first semi-transparent region 1 proximal to the third region 3 and the first portion 101 of the second semi-transparent region 2 proximal to the third region 3 is greater than the second distance between the second portion 102 of the first semi-transparent region 1 distal to the third region 3 and the second portion 102 of the second semi-transparent region 2 distal to the third region 3, such that a width of a portion, proximal to the third region 3, of the "three-sided loop" region formed by the first semi-transparent region 1, the second semi-transparent region 2 and the third region 3 in a surrounding manner can be increased relative to a width of a portion of the "three-sided loop" region distal to the third region 3. In this way, when the mask is used for exposing and etching to simultaneously form the patterns of the common electrode and the common electrode signal line on the array substrate, a width range of a portion, proximal to the common electrode signal line, of the "three-sided loop" region where the residual etching solution in the two wet etching processes is positioned is increased, so that a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is finally alleviated or avoided. At present, with the mask, the defect of short circuit between the data line and the common electrode line is reduced from 0.50% to 0.10%.

Optionally, the first semi-transparent region 1 and the second semi-transparent region 2 have the same shape and size, and are mirror-symmetrical with a center line of the interval as an axis; a ratio of a size of the first portion 101 along the second direction F to a size of the second portion 102 along the second direction F ranges from 1/20 to 1. Namely, a length of the first semi-transparent region 1 and the second semi-transparent region 2 along a direction away from the third region 3 is divided into 20 parts, and the share of the length of the first portion 101 along the direction away from the third region 3 is a range of 1 to 10. In this way, it ensures that the aperture ratio and the light transmittance of the array substrate can be improved better while the array substrate has higher resolution; and a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is alleviated or avoided.

Further, optionally, in this embodiment, a size of the first portion 101 along the second direction F is greater than or equal to 5 μm.

In this embodiment, further optionally, the size ratio X/m of the second distance to the first distance ranges from $X/(X+L/5)$ to $X/(X+L/10)$, where X is a size of the second distance, m is a size of the first distance, and L is a width of each of the second portions 102 of the first semi-transparent region 1 and the second semi-transparent region 2 along the first direction E; a width of each of the first portions 101 of the first semi-transparent region 1 and the second semi-transparent region 2 along the first direction E is in a range of 9L/10 to 19L/20. The first portions 101 and the second portions 102 of the first semi-transparent region 1 and the second semi-transparent region 2 are rectangular. The width of the second portion 102 of the first semi-transparent region 1 is divided into 20 parts, the width of the second portion 102 of the second semi-transparent region 2 is also divided into 20 parts; a size of each part is L/20, a size of the second distance is X (constant), a size m of the first distance ranges from X+L/20+L/20 to X+L/10+L/10, namely, the size m of the first distance ranges from X+L/10 to X+L/5. In this way, the distance between the first portions 101 of the first semi-transparent region 1 and the second semi-transparent region 2 is increased by sacrificing part of the width of the first portions 101. On one hand, compared with the mask in which a distance between the first semi-transparent region 1 and the second semi-transparent region 2 is set to be the second distance of X, it ensures that the aperture ratio and the light transmittance in the array substrate are increased while the array substrate has a higher resolution; on the other hand, a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is alleviated or avoided.

Further, optionally, in this embodiment, a size of the first distance is greater than or equal to 20 μm. For example, in this embodiment, a size of the second distance is 16 μm, and the size of the first distance is 23 μm.

Further, a spacing region between the first portions 101 of the first semi-transparent region 1 and the second semi-transparent region 2 proximal to the third region 3 is a rectangle, and the first distance is a width of the rectangular spacing region in the first direction E. Therefore, the mask can be better manufactured by a traditional manufacturing process, and the patterns of the common electrode and the common electrode signal line on the array substrate can be more easily manufactured by the traditional process. Further, the spacing region is a rectangle so that a width range of a portion, proximal to the common electrode signal line, of the "three-sided loop" region where the residual etching solution in the two wet etching processes is positioned on the array substrate is increased, a distribution range of the generated metal particles is increased after the residual etching solution corrodes the edge of the gate metal film layer, and further, the condition that a short circuit is generated between the data line and the common electrode line is alleviated or avoided.

Figure 5:
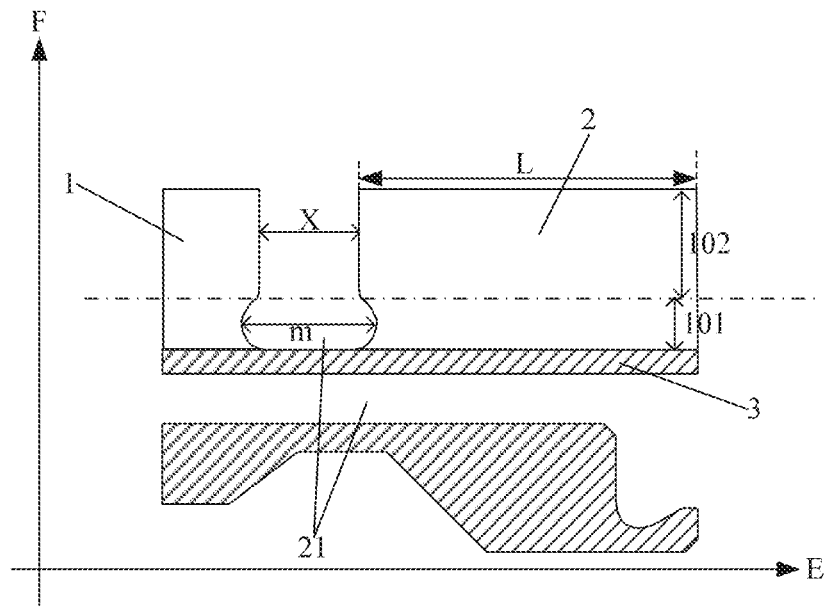
FIG. 5 is a top view of a partial structure of another mask in an exemplary embodiment of the present disclosure.

Further, optionally, as shown in FIG. 5, each of the opposite edge lines of the spacing region between the first portions 101 of the first semi-transparent region 1 and the second semi-transparent region 2 may be in a semi-circular arc shape. Here, m is the maximum dimension of the spacing region between the first portions 101 of the first semi-transparent region 1 and the second semi-transparent region 2 along the first direction E. Therefore, the mask can be better manufactured by a traditional manufacturing process, and the patterns of the common electrode and the common electrode signal line on the array substrate can be more easily manufactured by the traditional process. Further, the spacing region has the above shape such that a width range of a portion, proximal to the common electrode signal line, of the "three-sided loop" region where the residual etching solution in the two wet etching processes is positioned on the array substrate is increased, so that a distribution range of the generated metal particles is increased after the residual etching solution corrodes the edge of the gate metal film layer, and the condition that a short circuit is generated between the data line and the common electrode line is alleviated or avoided.

In the mask provided in the exemplary embodiment, the first distance between the first portion of the first semi-transparent region proximal to the third region and the first portion of the second semi-transparent region proximal to the third region is greater than the second distance between the second portion of the first semi-transparent region distal to the third region and the second portion of the second semi-transparent region distal to the third region, such that a width of a portion, proximal to the third region, of the "three-sided loop" region formed by the first semi-transparent region, the second semi-transparent region and the third region in a surrounding manner can be increased relative to a width of a portion of the "three-sided loop" region distal to the third region, so that when the mask is used for exposing and etching to simultaneously form the patterns of the common electrode and the common electrode signal line on the array substrate, a width range of a portion, proximal to the common electrode signal line, of the "three-sided loop" region where the residual etching solution in the two wet etching processes is positioned is increased, a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is finally alleviated or avoided.

Figure 6:
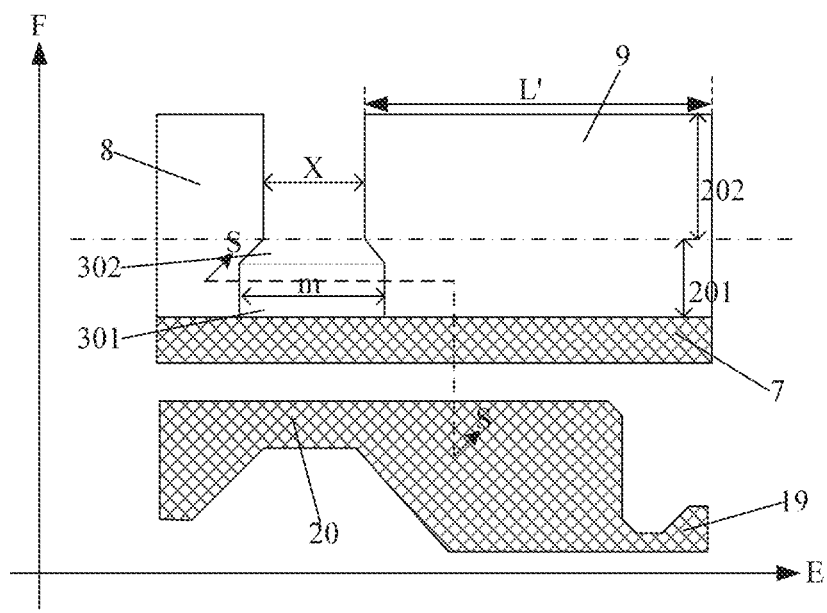
FIG. 6 is a top view of a partial structure of an array substrate formed by using the mask of FIG. 4 through an exposure process in an exemplary embodiment of the present disclosure.
Figure 7:
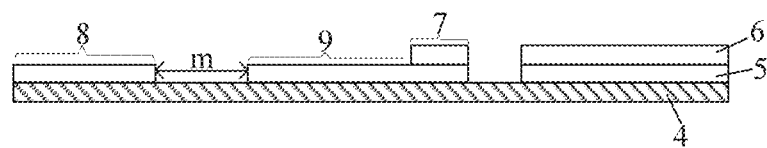
FIG. 7 is a partial cross-sectional view taken along a section line SS of FIG. 6.

Another exemplary embodiment of the present disclosure provides an array substrate, as shown in FIGS. 6 and 7, including a substrate 4 and a first conductive layer 5 and a second conductive layer 6 sequentially stacked on the substrate 4; an orthographic projection of the first conductive layer 5 on the substrate 4 and an orthographic projection of the second conductive layer 6 on the substrate 4 have an overlapping region; portions of the first conductive layer 5 and the second conductive layer 6 in the overlapping region form a first conductive pattern 7; the first conductive pattern 7 has a pattern extending along a first direction E; a portion of the first conductive layer 5 outside the overlapping region includes a second conductive pattern 8 and a third conductive pattern 9; the second conductive pattern 8 and the third conductive pattern 9 have an interval therebetween, are connected to the first conductive pattern 7, respectively, are located on the same side of the first conductive pattern 7 and extend along a second direction F; a first distance between a first region 201 of the second conductive pattern 8 proximal to the first conductive pattern 7 and a first region 201 of the third conductive pattern 9 proximal to the first conductive pattern 7 is larger than a second distance between a second region 202 of the second conductive pattern 8 distal to the first conductive pattern 7 and a second region 202 of the third conductive pattern 9 distal to the first conductive pattern 7.

The array substrate is manufactured by exposing with the mask in the embodiment. Specifically, the first semi-transparent region and the second semi-transparent region of the mask are respectively used for exposing and forming patterns of the second conductive pattern 8 and the third conductive pattern 9 on the array substrate; the third region of the mask is used for exposing and forming a pattern of the first conductive pattern 7 on the array substrate; and the spacing region between the first semi-transparent region and the second semi-transparent region on the mask is used for exposing and forming a spacing region between the second conductive pattern 8 and the third conductive pattern 9 on the array substrate.

In the array substrate, the first distance between the first region 201 of the second conductive pattern 8 proximal to the first conductive pattern 7 and the first region 201 of the third conductive pattern 9 proximal to the first conductive pattern 7 is larger than the second distance between the second region 202 of the second conductive pattern 8 distal to the first conductive pattern 7 and the second region 202 of the third conductive pattern 9 distal to the first conductive pattern 7, such that a width of a portion, proximal to the first conductive pattern 7, of the "three-sided loop" region formed by the second conductive pattern 8, the third conductive pattern 9 and the first conductive pattern 7 in a surrounding manner can be increased relative to a width of a portion of the "three-sided loop" region distal to the first conductive pattern 7. In this way, when the mask in the above embodiment is used for exposing and etching to form the patterns of the second conductive pattern 8, the third conductive pattern 9 and the first conductive pattern 7 on the array substrate, a width range of a portion, proximal to the first conductive pattern 7, of the "three-sided loop" region where the residual etching solution in the two wet etching processes is positioned is increased, so that a distribution range of the generated metal particles is increased after the residual etching solution corrodes the edge of the first conductive layer 5 and/or the second conductive layer 6, and the sharpness degree of the appearance of the metal particle accumulation formed by the accumulation of metal particles is reduced. Thus, the condition that the metal particles penetrate through the insulating layer subsequently formed on the second conductive layer 6 and in turn contact a third metal layer formed after the insulating layer is formed is alleviated or avoided, so that the condition that a short circuit is generated between the third metal layer and the first conductive layer 5 and/or the second conductive layer 6 is finally alleviated or avoided.

In this embodiment, the array substrate is an ADS (Advanced Super Dimension Switch) type array substrate. The first conductive layer 5 is a transparent conductive film layer, such as an ITO film layer; and the second conductive layer 6 is a metal conductive film layer, such as a gate metal film layer. An insulating layer and a third metal layer (such as a source drain metal layer) are further sequentially stacked on a side of the second conductive layer 6 of the array substrate distal to the substrate 4 along a direction away from the substrate 4, and the third metal layer includes a data line pattern. The first conductive pattern 7 is a common electrode signal line, and the second conductive pattern 8 and the third conductive pattern 9 are common electrodes located in adjacent pixel regions, respectively; the array substrate further includes the insulating layer and the data line, which are sequentially stacked on a side of the second conductive layer 6 distal to the substrate 4; an orthographic projection of the insulating layer on the substrate 4 covers the whole substrate 4, and an orthographic projection of the data line on the substrate 4 is located in the spacing region between the second conductive pattern 8 and the third conductive pattern 9 and extends to intersect with the first conductive pattern 7.

In addition, it should be noted that the array substrate further includes the gate electrode 19 and the gate line 20 which have the same two-layer conductive material structure as the first conductive pattern 7 and are formed at the same time as the first conductive pattern 7. The gate electrode 19 is connected to the gate line 20, and both the gate electrode 19 and the gate line 20 are spaced apart from the first conductive pattern 7 to be insulated from the first conductive pattern 7.

In this embodiment, in the array substrate, the first distance between the first region 201 of the second conductive pattern 8 proximal to the first conductive pattern 7 and the first region 201 of the third conductive pattern 9 proximal to the first conductive pattern 7 is larger than the second distance between the second region 202 of the second conductive pattern 8 distal to the first conductive pattern 7 and the second region 202 of the third conductive pattern 9 distal to the first conductive pattern 7, such that on one hand, an area of the second conductive pattern 8 and the third conductive pattern 9 can be increased compared with the array substrate in which a distance between the second conductive pattern 8 and the third conductive pattern 9 is set to be the second distance, thereby increasing an area of the common electrode in the pixel region on the array substrate, increasing an aperture area in the pixel region to increase the light transmittance in the pixel region, and finally ensuring that the aperture ratio and the light transmittance in the array substrate are increased while the array substrate has a higher resolution; on the other hand, a width of a portion, proximal to the common electrode signal line, of the "three-sided loop" region formed by the common electrode and the common electrode signal line in a surrounding manner can be increased relative to a width of a portion of the "three-sided loop" region distal to the common electrode signal line. Thus, when the mask in the above embodiment is used for exposing and etching to form the patterns of the common electrode and the common electrode signal line on the array substrate, a width range of a portion, proximal to the common electrode signal line, of the "three-sided loop" region where the residual etching solution in the two wet etching processes is positioned is increased, so that a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is finally alleviated or avoided. At present, the array substrate is manufactured with the mask in the above embodiment, such that the defect of short circuit between the data line and the common electrode line is reduced from 0.50% to 0.10%.

It should be noted that the arrangement of the film layers on the array substrate is not limited to the above case in this embodiment, and the film layers and the conductive patterns that need to be formed on the array substrate after exposure by using the mask in the above embodiment may also be other cases different from, but similar to, the above case in this embodiment.

Optionally, in this embodiment, the second conductive pattern 8 and the third conductive pattern 9 have the same shape and size, and are mirror-symmetrical with a center line of the interval as an axis; a ratio of a size of the first region 201 along the second direction F to a size of the second region 202 along the second direction F ranges from 1/20 to 1. Namely, a length of the second conductive pattern 8 and the third conductive pattern 9 along the second direction F is divided into 20 parts, and the share of the length of the first region 201 along the second direction F is a range of 1 to 10. In this way, it ensures that the aperture ratio and the light transmittance of the array substrate can be improved better while the array substrate has higher resolution; and a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is further alleviated or avoided.

Further, optionally, in this embodiment, a size of the first region 201 along the second direction F is greater than or equal to 5 μm.

In this embodiment, further optionally, a size ratio X/m of the second distance to the first distance ranges from X/(X+L'/5) to X/(X+L'/10), where X is a size of the second distance, m is a size of the first distance, and L' is a width of each of the second regions 202 of the second conductive pattern 8 and the third conductive pattern 9 along the first direction E; a width of each of the first regions 201 of the second conductive pattern 8 and the third conductive pattern 9 along the first direction E is in a range of 9L'/10 to 19L'/20. The second regions 202 of the second conductive pattern 8 and the third conductive pattern 9 are rectangular. The width of the second region 202 of the second conductive pattern 8 is divided into 20 parts, the width of the second region 202 of the third conductive pattern 9 is also divided into 20 parts; a size of each part is L'/20, a size of the second distance is X which is constant), a size m of the first distance ranges from X+L'/20+L'/20 to X+L'/10+L'/10, namely, the size m of the first distance ranges from X+L'/10 to X+L'/5. In this way, the distance between the first regions 201 of the second conductive pattern 8 and the third conductive pattern 9 is increased by sacrificing part of the width of the first regions 201. On one hand, compared with the array substrate in which a distance between the second conductive pattern 8 and the third conductive pattern 9 is set to be the second distance, it ensures that the aperture ratio and the light transmittance in the array substrate are increased while the array substrate has a higher resolution; on the other hand, a distribution range of the generated metal particles is increased after the residual etching solution corrodes the edge of the gate metal film layer, and the sharpness degree of the appearance of the metal particle accumulation formed by the accumulation of metal particles is reduced. Thus, the condition that the metal particles penetrate through the insulating layer subsequently formed on the gate metal film layer and in turn contact the source drain metal layer formed after the insulating layer is formed is alleviated or avoided, so that the condition that a short circuit is generated between the data line and the common electrode line is further alleviated or avoided.

Further, optionally, in this embodiment, a size of the first distance m is greater than or equal to 20 μm. For example, in the present embodiment, the size of the second distance X is 16 μm, and the size of the first distance m is 23 μm.

Optionally, in this embodiment, the spacing region between the first regions 201 of the second conductive pattern 8 and the third conductive pattern 9 includes a first sub-region 301 and a second sub-region 302, sequentially arranged away from the first conductive pattern 7 along the second direction F. An orthographic projection of the first sub-region 301 on the substrate 4 is rectangular, and an orthographic projection of the second sub-region 302 on the substrate 4 is trapezoidal; the shorter base of the second sub-region 302 is further away from the first conductive pattern 7 than the longer base thereof. It should be noted here that m denotes the maximum distance between the first regions 201 of the second conductive pattern 8 and the third conductive pattern 9 along the first direction E. The spacing region having the above shape between the first regions 201 of the second conductive pattern 8 and the third conductive pattern 9 is formed by exposing with the mask in FIG. 4. Therefore, the patterns of the common electrode and the common electrode signal line on the array substrate can be more easily manufactured by the traditional process. Further, the spacing region is a rectangle so that a width range of a portion, proximal to the common electrode signal line, of the "three-sided loop" region where the residual etching solution in the two wet etching processes is positioned on the array substrate is increased, a distribution range of the generated metal particles is increased after the residual etching solution corrodes the edge of the gate metal film layer, and the condition that a short circuit is generated between the data line and the common electrode line is alleviated or avoided.

Figure 8:
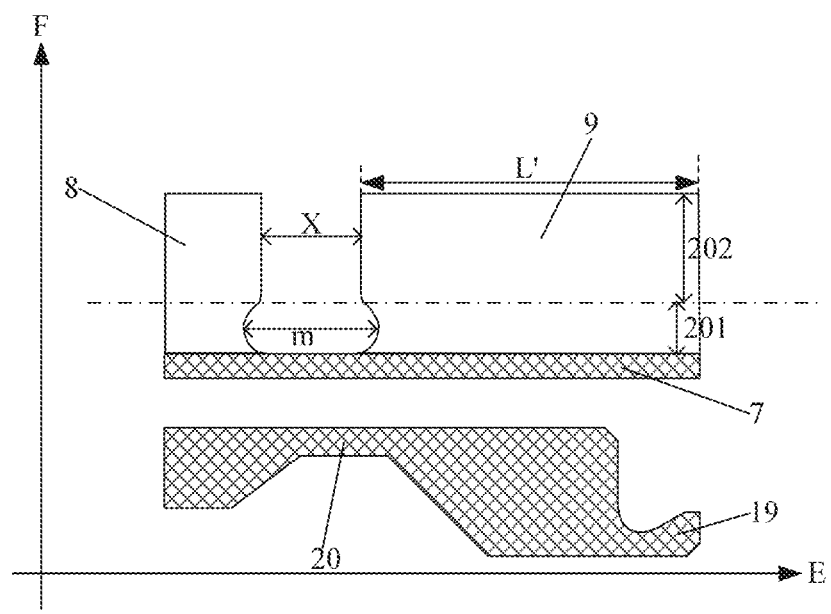
FIG. 8 is a top view of a partial structure of an array substrate formed by using the mask of FIG. 5 through an exposure process in an exemplary embodiment of the present disclosure.

Further, optionally, as shown in FIG. 8, each of the opposite edge lines of the spacing region between the first regions 201 of the second conductive pattern 8 and the third conductive pattern 9 may be in a semi-circular arc shape. Here, m is the maximum distance of the spacing region between the first regions 201 of the second conductive pattern 8 and the third conductive pattern 9 along the first direction E. The spacing region having the above shape between the first regions 201 of the second conductive pattern 8 and the third conductive pattern 9 is formed by exposing with the mask in FIG. 5. Therefore, the patterns of the common electrode and the common electrode signal line on the array substrate can be more easily manufactured by the conventional process. Further, the spacing region has the above shape so that a width range of a portion, proximal to the common electrode signal line, of the "three-sided loop" region where the residual etching solution in the two wet etching processes is positioned on the array substrate is increased, a distribution range of the generated metal particles is increased after the residual etching solution corrodes the edge of the gate metal film layer, and the condition that a short circuit is generated between the data line and the common electrode line is further alleviated or avoided.

Based on the foregoing structure of the array substrate, an exemplary embodiment of the present disclosure provides a method for manufacturing the array substrate, including steps S1 to S6.

Step S1 includes sequentially forming a first conductive layer film and a second conductive layer film on a substrate, and forming a photoresist on the second conductive layer film.

In this step, the first conductive layer film is made of a transparent conductive material, such as ITO or IZO. The second conductive layer film is made of copper or copper alloy. The first conductive layer film and the second conductive layer film may be formed on the substrate through a magnetron sputtering method, and the photoresist is coated on the second conductive layer film.

Step S2 includes exposing and developing the substrate provided with the photoresist by using the mask in the embodiment, and then, removing the photoresist on the substrate corresponding to a spacing region between a first semi-transparent region and a second semi-transparent region, partially reserving the photoresist on the substrate corresponding to the first semi-transparent region and the second semi-transparent region, and completely reserving the photoresist on the substrate corresponding to a third region.

Step S3 includes removing the second conductive layer film and the first conductive layer film on the substrate corresponding to the spacing region between the first semi-transparent region and the second semi-transparent region, through an etching process.

In the step, different etching solutions are adopted to respectively etch and remove the second conductive layer film and the first conductive layer film in the region not covered by the photoresist. In the step, the etching solution may remain in the region after etching and removing the second conductive layer film and the first conductive layer film in the region not covered by the photoresist on the substrate, and corrode the edge of the etched second conductive layer film to some extent to form copper particles.

In this step, after etching, the substrate is cleaned with plasma water.

Step S4 includes completely removing the photoresist on the substrate corresponding to the first semi-transparent region and the second semi-transparent region, and removing a portion of the completely reserved photoresist on the substrate corresponding to the third region.

In this step, the photoresist partially reserving on the substrate is removed by ashing, and a portion of the completely reserved photoresist on the substrate is removed.

Step S5 includes etching and removing the second conductive layer film on the substrate corresponding to the first semi-transparent region and the second semi-transparent region to form a second conductive pattern and a third conductive pattern.

In this step, after forming the second conductive pattern and the third conductive pattern, the etching solution may remain in the "three-sided loop" region formed by the second conductive pattern, the third conductive pattern, and the portion of the conductive layer film covered by the photoresist, and may corrode the edge of the etched second conductive layer film to some extent to form copper particles.

In this step, after etching, the substrate is cleaned with plasma water.

Step S6 includes removing the remaining portion of the completely reserved photoresist on the substrate corresponding to the third region, thereby forming the first conductive pattern.

In this step, the remaining portion of the completely reserved photoresist on the substrate is removed to form the first conductive pattern, and simultaneously, a pattern including the gate electrode and the gate line is formed.

In this embodiment, the method for manufacturing an array substrate further includes a step of sequentially forming an insulating layer and a data line after step S6, such that the data line is located in the spacing region between the second conductive pattern and the third conductive pattern, and the data line further extends to spatially intersect with the first conductive pattern. The distance between the first regions of the second conductive pattern and the third conductive pattern is increased, so that a defect that a short circuit occurs between the data line and the common electrode line is reduced from 0.50% to 0.10%. Substantially no short circuit occurs between the data line and the first conductive pattern. Since the insulating layer and the data line are manufactured by conventional processes, detailed manufacturing processes are not described herein.

In the manufacturing method for the array substrate, etching solution remains in the two etching processes of the step S3 and the step S5, corrodes the edge of the second conductive layer film to form copper particles. By adopting the mask in the embodiment, a width of a portion, proximal to the first conductive pattern, of the "three-sided loop" region formed by the second conductive pattern, the third conductive pattern and the first conductive pattern in a surrounding manner can be increased relative to a width of a portion of the "three-sided loop" region distal to the first conductive pattern, so that a width range of a portion, proximal to the first conductive pattern, of the "three-sided loop" region where the residual etching solution in the two wet etching processes is positioned is increased, a distribution range of the generated metal particles is increased after the residual etching solution corrodes the edge of the second conductive layer, and the sharpness degree of the appearance of the metal particle accumulation formed by the accumulation of metal particles is reduced. Thus, the condition that the metal particles penetrate through the insulating layer subsequently formed on the second conductive layer and in turn contact the third metal layer formed after the insulating layer is formed is alleviated or avoided, so that the condition that a short circuit is generated between the third metal layer and the second conductive layer is finally alleviated or avoided.

In the array substrate provided in this exemplary embodiment, the first distance between the first region of the second conductive pattern proximal to the first conductive pattern and the first region of the third conductive pattern proximal to the first conductive pattern is larger than the second distance between the second region of the second conductive pattern distal to the first conductive pattern and the second region of the third conductive pattern distal to the first conductive pattern, so that a width of a portion, proximal to the first conductive pattern, of the "three-sided loop" region formed by the second conductive pattern, the third conductive pattern and the first conductive pattern in a surrounding manner can be increased relative to a width of a portion of the "three-sided loop" region distal to the first conductive pattern, so that when the mask in the above embodiment is used for exposing and etching to form the patterns of the second conductive pattern, the third conductive pattern and the first conductive pattern on the array substrate, a width range of a portion, proximal to the first conductive pattern, of the "three-sided loop" region where the residual etching solution in the two wet etching processes is positioned is increased, a distribution range of the generated metal particles is increased after the residual etching solution corrodes the edge of the first conductive layer and/or the second conductive layer, and the sharpness degree of the appearance of the metal particle accumulation formed by the accumulation of metal particles is reduced. Thus, the condition that the metal particles penetrate through the insulating layer subsequently formed on the second conductive layer and in turn contact a third metal layer formed after the insulating layer is formed is alleviated or avoided, so that the condition that a short circuit is generated between the third metal layer and the first conductive layer and/or the second conductive layer is finally alleviated or avoided.

Another exemplary embodiment of the present disclosure provides a display panel, which includes the array substrate in the above embodiments and an opposite substrate.

The array substrate and the opposite substrate are aligned and assembled to form a cell, and a cell gap is filled with liquid crystal molecules. The opposite substrate may be a color film substrate.

By adopting the array substrate in the embodiment, on one hand, it ensures that the aperture ratio and the light transmittance of the array substrate can be improved better while the array substrate has higher resolution; on the other hand, the condition that an open circuit between the upper and lower conductive layers can be alleviated or avoided, thereby improving the yield and the quality of the display panel.

The display panel provided by the exemplary embodiment of the present disclosure may be any product or component having a display function, such as an LCD panel, an LCD television, a display, a mobile phone, and a navigator.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An array substrate, comprising: a substrate, and a first conductive layer and a second conductive layer sequentially stacked on the substrate;
   wherein an orthographic projection of the first conductive layer on the substrate and an orthographic projection of the second conductive layer on the substrate have an overlapping region; portions of the first conductive layer and the second conductive layer in the overlapping region constitute a first conductive pattern; the first conductive pattern has a pattern extending along a first direction; a portion of the first conductive layer outside the overlapping region includes a second conductive pattern and a third conductive pattern; the second conductive pattern and the third conductive pattern have an interval therebetween, are connected to the first conductive pattern, respectively, are on a same side of the first conductive pattern and extend along a second direction;
   wherein a first distance between a first region of the second conductive pattern proximal to the first conductive pattern and a first region of the third conductive pattern proximal to the first conductive pattern is larger than a second distance between a second region of the second conductive pattern distal to the first conductive pattern and a second region of the third conductive pattern distal to the first conductive pattern,
   a spacing region between the first regions of the second conductive pattern and the third conductive pattern comprises a first sub-region and a second sub-region sequentially arranged away from the first conductive pattern along the second direction,
   an orthographic projection of the first sub-region on the substrate is rectangular, and an orthographic projection of the second sub-region on the substrate is trapezoidal; and
   a shorter base of the second sub-region is further away from the first conductive pattern than a longer base of the second sub-region.

2. The array substrate of claim 1, wherein the second conductive pattern and the third conductive pattern are the same in shape and size, and are mirror-symmetrical with a center line of the interval as an axis;
   a ratio of a size of the first region along the second direction to a size of the second region along the second direction ranges from 1/20 to 1.

3. The array substrate of claim 2, wherein a size ratio of the second distance to the first distance is in a range of $X/(X+L'/5)$ to $X/(X+L'/10)$, where X is a size of the second distance, L' is a width of each of the second regions of the second conductive pattern and the third conductive pattern along the first direction; and a width of each of the first regions of the second conductive pattern and the third conductive pattern along the first direction is in a range of $9L'/10$ to $19L'/20$.

4. The array substrate of claim 3, wherein the size of the first region along the second direction is greater than or equal to 5 μm.

5. The array substrate of claim 4, wherein the first distance is greater than or equal to 20 μm.

6. The array substrate of claim 5, wherein the second distance is 16 μm and the first distance is 23 μm.

7. The array substrate of claim 1, wherein two opposite edge lines of the spacing region between the first regions of the second and third conductive patterns are in a semicircular arc shape.

8. The array substrate of claim 1, wherein the first conductive pattern is a common electrode signal line, and the second conductive pattern and the third conductive pattern are common electrodes respectively at adjacent pixel regions;
   the array substrate further comprises an insulating layer and a data line sequentially stacked on a side of the second conductive layer distal to the substrate; and
   an orthographic projection of the insulating layer on the substrate covers the whole substrate, and an orthographic projection of the data line on the substrate is in a spacing region between the second conductive pattern and the third conductive pattern and extends to intersect with the first conductive pattern.

9. A mask, used for forming the array substrate of claim 1 and comprising a first semi-transparent region, a second semi-transparent region, and a third region, wherein the third region has a pattern extending along the first direction; the first semi-transparent region and the second semi-transparent region have an interval therebetween; the first semi-transparent region and the second semi-transparent region are respectively connected to the third region, are on a same side of the third region and extend along the second direction;
   wherein a first distance between a first portion of the first semi-transparent region proximal to the third region and a first portion of the second semi-transparent region proximal to the third region is greater than a second distance between a second portion of the first semi-transparent region distal to the third region and a second portion of the second semi-transparent region distal to the third region.

10. The mask of claim 9, wherein the first semi-transparent region and the second semi-transparent region are the same in shape and size, and are mirror-symmetrical with a center line of the interval as an axis; and a ratio of a size of the first portion of each of the first and second semi-transparent regions along the second direction to a size of the second portion of each of the first and second semi-transparent regions along the second direction ranges from 1/20 to 1.

11. The mask of claim 10, wherein a size ratio of the second distance to the first distance is in a range of X/(X+L/5) to X/(X+L/10), where X is a size of the second distance, L is a width of each of the second portions of the first semi-transparent region and the second semi-transparent region along the first direction; and a width of each of the first portions of the first semi-transparent region and the second semi-transparent region along the first direction is in a range of 9L/10 to 19L/20.

12. The mask of claim 11, wherein the size of the first portion of each of the first and second semi-transparent regions along the second direction is greater than or equal to 5 μm.

13. The mask of claim 12, wherein the first distance is greater than or equal to 20 μm.

14. The mask of claim 13, wherein the second distance is 16 μm and the first distance is 23 μm.

15. The mask of claim 9, wherein a spacing region between the first portions of the first and second semi-transparent regions is rectangular.

16. The mask of claim 9, wherein two opposite edge lines of a spacing region between the first portions of the first and second semi-transparent regions are in a semi-circular arc shape.

17. A manufacturing method for an array substrate, comprising steps of:
sequentially forming a first conductive layer film and a second conductive layer film on a substrate, and forming a photoresist on the second conductive layer film;
exposing and developing the substrate on which the photoresist is formed, by using the mask of claim 11, and then, removing the photoresist on the substrate corresponding to a spacing region between the first semi-transparent region and the second semi-transparent region, partially reserving the photoresist on the substrate corresponding to the first semi-transparent region and the second semi-transparent region, and completely reserving the photoresist on the substrate corresponding to the third region;
removing the second conductive layer film and the first conductive layer film on the substrate corresponding to the spacing region between the first semi-transparent region and the second semi-transparent region, by an etching process;
completely removing the photoresist on the substrate corresponding to the first semi-transparent region and the second semi-transparent region, and removing a portion of the completely reserved photoresist on the substrate corresponding to the third region;
removing the second conductive layer film on the substrate corresponding to the first semi-transparent region and the second semi-transparent region to form a second conductive pattern and a third conductive pattern, by an etching process, wherein the second conductive pattern and the third conductive pattern have an interval therebetween; and
removing a remaining portion of the completely reserved photoresist on the substrate corresponding to the third region, thereby forming a first conductive pattern, wherein the first conductive pattern has a pattern extending along the first direction, the second conductive pattern and the third conductive pattern are connected to the first conductive pattern, respectively, are on a same side of the first conductive pattern and extend along the second direction, and a first distance between a first region of the second conductive pattern proximal to the first conductive pattern and a first region of the third conductive pattern proximal to the first conductive pattern is larger than a second distance between a second region of the second conductive pattern distal to the first conductive pattern and a second region of the third conductive pattern distal to the first conductive pattern,
wherein a spacing region between the first regions of the second conductive pattern and the third conductive pattern comprises a first sub-region and a second sub-region sequentially arranged away from the first conductive pattern along the second direction,
an orthographic projection of the first sub-region on the substrate is rectangular, and an orthographic projection of the second sub-region on the substrate is trapezoidal; and
a shorter base of the second sub-region is further away from the first conductive pattern than a longer base of the second sub-region.

18. A display panel, comprising the array substrate of claim 1 and an opposite substrate.

* * * * *